(12) United States Patent
Tsai et al.

(10) Patent No.: US 11,183,405 B2
(45) Date of Patent: *Nov. 23, 2021

(54) SEMICONDUCTOR MANUFACTURING APPARATUS

(71) Applicant: TAIWAN SEMICONDUCTOR MANUFACTURING COMPANY LTD., Hsinchu (TW)

(72) Inventors: Chao-Tzung Tsai, Taichung (TW); Tzu Ken Lin, Taichung (TW); I-Chang Wu, Taichung (TW); Ching-Lun Lai, Taichung (TW); Li-Jia Liou, Chiayi (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 111 days.

This patent is subject to a terminal disclaimer.

(21) Appl. No.: 16/389,444

(22) Filed: Apr. 19, 2019

(65) Prior Publication Data

US 2019/0244841 A1      Aug. 8, 2019

Related U.S. Application Data

(63) Continuation of application No. 14/311,141, filed on Jun. 20, 2014, now Pat. No. 10,269,599.

(51) Int. Cl.
*H01L 21/67* (2006.01)
*C23C 14/54* (2006.01)
*C23C 16/52* (2006.01)
*C23C 16/44* (2006.01)

(52) U.S. Cl.
CPC .... *H01L 21/67253* (2013.01); *C23C 16/4405* (2013.01); *C23C 16/52* (2013.01)

(58) Field of Classification Search
CPC .......... H01J 37/32862; H01J 37/32871; C23C 16/45563–4558
See application file for complete search history.

(56) References Cited

U.S. PATENT DOCUMENTS

2015/0118416 A1 *   4/2015   Jang ................... C23C 16/45519
                                                                  427/575

OTHER PUBLICATIONS

Machine translation of JP 2006-049422, Okada et al., Feb. 2006 (Year: 2006).*

* cited by examiner

*Primary Examiner* — Karla A Moore
*Assistant Examiner* — Nathan K Ford
(74) *Attorney, Agent, or Firm* — WPAT, P.C., Intellectual Property Attorneys; Anthony King

(57) ABSTRACT

A semiconductor manufacturing apparatus includes an air distributor inside a chamber. The air distributor includes a first annular plate and a second annular plate disposed in an interior volume of the chamber, and an inner surface of the first annular plate and an inner surface of the second annular plate are connected to each other. A hollow region is defined by the first annular plate and the second annular plate. A gas through hole is extended from an outer surface of the first annular plate to the inner surface of the first annular plate. A plurality of ditches are between the inner surface of the first annular plate and the inner surface of the second annular plate, wherein the ditches are connected with the gas through hole and extended from the gas through hole to the hollow region to blow gas toward the hollow region.

20 Claims, 10 Drawing Sheets

SEMICONDUCTOR MANUFACTURING APPARATUS

CROSS REFERENCE TO RELATED APPLICATIONS

This application is a continuation of application Ser. No. 14/311,141, filed on Jun. 20, 2014, now U.S. Pat. No. 10,269,599 B2, which is incorporated by reference in its entirety.

BACKGROUND

Endpoint detection is a method adopted in semiconductor fabrication for detecting a completion of a process in order to stop the process on time. Various automated fabrication process may involve endpoint detection. For example, etching and/or deposition is known that an endpoint of an etching and/or deposition process may be determined by monitoring a level of emission of selected byproducts of the etching and/or deposition reaction. For example, an endpoint detector may be used for detecting byproducts of the etched and/or deposited layer in the exhaust stream of the etching chamber. The etching process is stopped when no more byproduct is detected.

Endpoint detection may also rely on light emitted by the plasma during the etching reaction. This light includes emissions at wavelengths representative of specific substances present in the plasma. Therefore, the level of a reaction byproduct may be monitored through measurement of emissions at the byproduct's particular emission wavelength. By monitoring the level of a byproduct which may originate from the layer being treated by plasma, the endpoint of the process is indicated by a sharp drop in the level of emitted reaction product. For example, in a plasma etching process wherein a layer of oxide is being removed, carbon monoxide (CO) is a typical byproduct released into the plasma. CO emits light at a wavelength of 483 nm. Therefore, when the oxide layer is fully removed, the CO emission decreases indicating the endpoint of the etch process.

However, the endpoint detection error is observed often time and sometime even causes wafer scrap because there is no endpoint being detected during a wafer patterning process. For the application on insitu chamber cleaning, the over or under etching due to the endpoint missing may either damage the chamber or leave residues falling on the wafers. Therefore, for these problems to be solved, relevant developments to advance the accuracy of detecting the endpoint are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the present disclosure, an apparatus is designed for various semiconductor manufacturing process such as dry etch or vapor deposition, especially for processes adopting plasma spectroscopy to monitor chamber or wafer condition. Different types of chamber, such as PVD chamber, CVD chamber, or etching chamber may be applied by the apparatus. The apparatus is installed proximally to a sidewall of a chamber to form an air curtain between chamber's inner space and an optical emission spectroscopy (OES). The air curtain is designed to prevent any air stream flowing toward the OES, thus avoiding byproducts forming on a transparent cover on the sidewall of the chamber. The lights emitted from the chamber are able to reach the OES without obstruction. Thus, the OES may detect the spectrum of plasma with high accuracy.

The air distributor has at least one internal gas tunnel built inside the distributor and connected to a gas through hole. Gas supplied from source external to the chamber is introduced into a hollow region of the gas distributor to form the air curtain by the internal gas tunnel.

Figure 1:
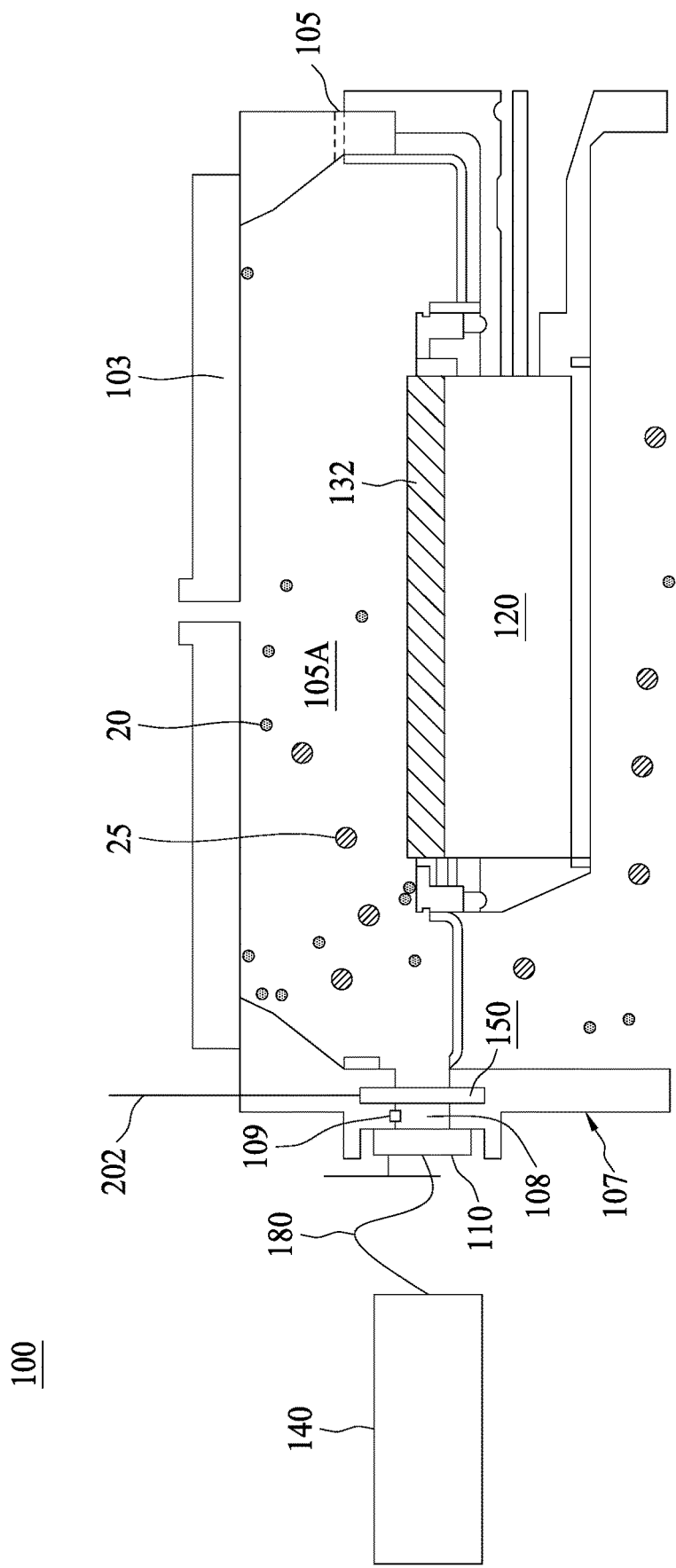
FIG. 1 is a cross sectional view of a semiconductor manufacturing apparatus having a chamber for accommodating a semiconductor wafer during operation in accordance with some embodiments of the present disclosure.

FIG. 1 is a semiconductor manufacturing apparatus 100 having a chamber 105 for accommodating a semiconductor wafer 132 during operation. A pedestal 120 is located in the chamber 105 for holding the wafer. In some embodiments, the pedestal 120 is a heater. In some embodiments, the pedestal 120 is an electrostatic chuck (ESC). Gas is introduced into inner space of the chamber 105 and ignited by a power source such as radio frequency (RF) generator to generate plasma. In some embodiments, the plasma is used to react with deposition film on the wafer in dry etch operation. Reactive gas such as $CF_4$, $CCl_4$, $CF_3Cl$, $COF_2$, $SF_6$, $C_2F_6$, $C_3F_8$, $C_2F_4$, $CF_2$, $CF_3$, $CCl_3$, F, Cl, Br, O (for resist), $F_2$, $Cl_2$, $Br_2$, is introduced above the wafer 132 and energized by a top coil 103 to generate ionized particles. The ionized particles 20 dropped on the top surface of wafer 132 and react with the atoms or molecules in the deposited film. Some inert gases such as nitrogen, argon or helium are also introduced into the chamber 105 as a carrier gas to distribute the ionized particles more evenly in the chamber 105. Inert gas can be used in plasma etching as a diluent and a plasma stabilizer. Diluents may give a process control variable. For example, an inert gas can be added to increase a total pressure while keeping partial pressures of other gases constant. In addition, some gas species can improve energy transfer from "hot" electrons to reactive gas molecules.

In some embodiments, the dry etch operation is performed in at least two stages. In the first stage, an OES 140 is used to monitor changes in chemical components inside the chamber 105. The OES 140 is connected to an optical fiber 180 that is attached near to a view port window 108 to collect a certain wavelength of light emission with spectroscopy. The chemical components change in the chamber 105 leads to changes of intensity or color of the light emission into the OES 140. The OES 140 sends an electrical signal to a computer that controls the chamber 105 to stop the first stage. For example, at the end of a polysilicon etch, a silicon line intensity with wavelength around 2882 Å may be reduced by a lack of silicon supply. The change of the line intensity detected by OES 140 provides signal to the computer to end the silicon etch process. In some embodiments, the first stage is also called endpoint stage because the process duration is determined by a time when the certain wavelength of light emission ends. The first stage is followed by a second stage. During the second stage, an extra etch time is introduced to further etches the wafer 132 to remove residues remained on the wafer 132. Byproducts 25 are also generated in the chamber 105 during the dry etch operation. The byproducts 25 usually contain a compound consisting of materials from wafer surface and ionized particles 20 during film removal or recombination in the chamber 105. Some byproducts, such as polymer are non-volatile and may grow in the chamber to form an unexpected film.

Typically, the dry etch operation is performed under a high vacuum environment, thus a transparent cover 110 is disposed proximally to chamber sidewall 107 to seal the view port window 108. In some embodiments as in FIG. 1, the transparent cover 110 has a size greater than the view port window 108. Light emission from inner space 105A of the chamber passes through the view port window 108 and the transparent cover 110 then arrives at the transparent cover 110. The optical fiber 180 attached on the transparent cover 110 collects the emitted light and further transmits to the OES 140.

The transparent cover 110 is made with some materials resistant to the plasma formed in the chamber. Moreover, the suitable materials are also transparent to the wavelengths of lights emitted from the chamber 105. In some embodiments, non-metallic material such as quartz or sapphire is used as a cover to separate the optical fiber 180 from the view port window 108. In some embodiments, the non-metallic transparent cover 110 is a ceramic material. The ceramic may be an oxide selected from a group including aluminum oxide ($Al_2O_3$), titanium dioxide ($TiO_2$), niobium pentoxide ($Nb_2O_5$), tantalum pentoxide ($Ta_2O_5$), cobalt tetroxide ($Co_3O_4$), chromium trioxide ($Cr_2O_3$), zirconium dioxide ($ZrO_2$), vanadium pentoxide ($V_2O_5$), magnesium oxide (MgO), yttria ($Y_2O_3$), etc. Surface of the material used for transparent cover 110 is anodized to possess a higher resistance to the reactive etchant in the plasma. A seal ring (not shown) is inserted between the transparent cover 110 and the sidewall 107 to prevent gas leaking from the chamber 105.

In the present disclosure, an air distributor 150 is disposed between the view port window 108 and inner space 105A. A side view of the air distributor 150 as shown in FIG. 1 is a plate embedded in the chamber wall. The air distributor 150 is connected to a gas line 202 so as to supply gas into the air distributor 150. In some embodiments, the gas line 202 is built in the chamber 105 and connected to a gas panel that also supplies other gases into the chamber 105. Some insert gases such as helium, argon, or nitrogen is used as source of the air distributor 150.

The air distributor 150 is made with materials resistant to the plasma formed in the chamber 105. In some embodiments, the suitable materials are non-metallic. In some embodiments, the non-metallic air distributor 150 is made with a ceramic material. The ceramic material may be an oxide selected from a group including aluminum oxide ($Al_2O_3$), titanium dioxide ($TiO_2$), niobium pentoxide ($Nb_2O_5$), tantalum pentoxide ($Ta_2O_5$), cobalt tetroxide ($Co_3O_4$), chromium trioxide ($Cr_2O_3$), zirconium dioxide ($ZrO_2$), vanadium pentoxide ($V_2O_5$), magnesium oxide (MgO), yttria ($Y_2O_3$), etc. Surface of the material used for air distributor 150 is anodized to possess a higher resistance to the reactive etchant in the plasma.

A pressure inside a view port window 108 should be constantly greater than a pressure inside an inner space 105A. Such condition is for keeping out byproducts 25, ionized particles 20, or other gas particles from reaching a transparent cover 110. For example, referring to FIG. 1, a view port window 108 may have a unit pressure control UPC 109 inside. An UPC 109 could sense the pressure inside a view port window 108. In some cases, when an UPC 109 detects a decrease in a pressure inside a view port window 108, the UPC 109 would send a feedback signal to have gas line 202 increasing gas flows into the view port window. Furthermore, when an UPC 109 detects an increase in a pressure inside a view port window 108, the UPC 109 would send a feedback signal to have gas line 202 decreasing gas flows into the view port window. Thus the UPC 109 could maintain a stable pressure inside a view port window 108 to keep a transparent cover 110 clean. For example, a view port window 108 has a volume of about 250 cm³. A stability time of flow from air distributor 150 may be about 15 seconds. Therefore, an UPC 109 may control a flow rate of an inert gas to keep a pressure inside a view port window 108 to be at a certain pressure. A flow rate of a gas is equal to a volume of the gas divided by a time the volume passes through. For example, an UPC 109 may control the flow rate of He gas to be about 1,000 cm³/min. For different types of gas, such as Ne or Ar, different flow rate may be derived to obtain the certain pressure.

Figure 2:
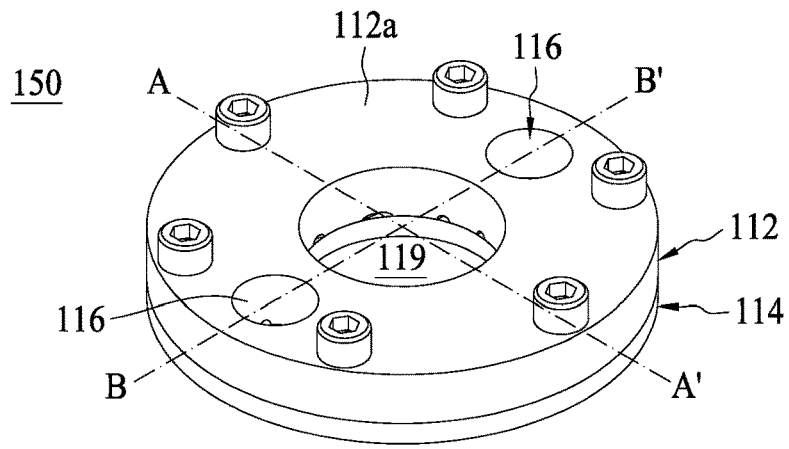
FIG. 2 is a perspective view of the air distributor in FIG. 1 in accordance with some embodiments of the present disclosure.

FIG. 2 is a perspective view of an air distributor 150 in accordance with some embodiments of the present disclosure. The air distributor 150 has a first annular plate 112 and a second annular plate 114. Surface 112a is a surface of the first annular plate 112 and facing toward the transparent cover 110 when the air distributor 150 is installed on the sidewall 107 as in FIG. 1. The two annular plates are fastened against each other to form as an integrated disk with a hollow region 119 around center. When the air distributor 150 is installed in the chamber. The hollow region 119 is aligned with the transparent cover 110 to provide a clear see-through for the optical fiber 180 to collect the light emission from chamber 105. In some embodiments, size of the hollow region 119 is greater or substantially same as the transparent cover 110 such that light emitted from the chamber 105 is not blocked by the air distributor 105.

A pair of gas through holes 116 is located symmetrically on the surface 112a of the first annular plate 112. In some embodiments, the gas through holes 116 are not arranged in a symmetrical manner on the surface 112a. Each gas through hole 116 is connected to a gas line 202 like in FIG. 1 when the air distributor 150 is installed in a chamber. In some embodiments, there are more or less than two through holes in an air distributor.

Figure 3:
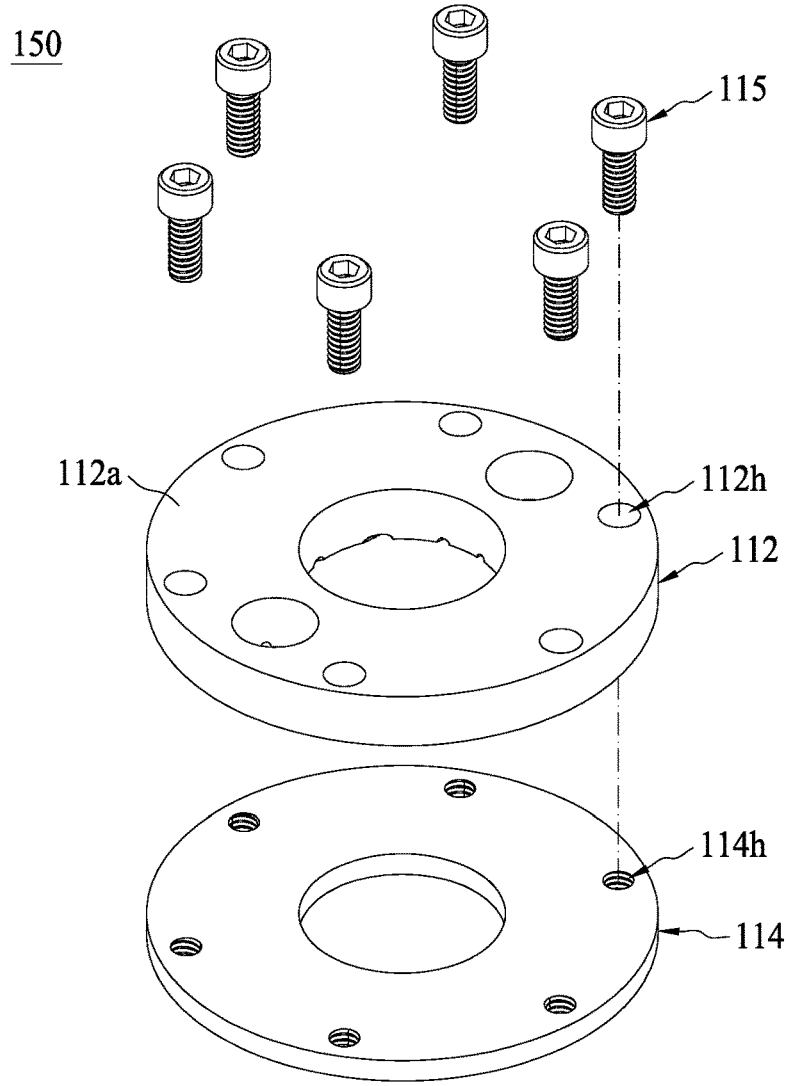
FIG. 3 is an explosion view of the air distributor in FIG. 2 in accordance with some embodiments of the present disclosure.

FIG. 3 is an explosion view of the air distributor 150 in FIG. 2. The first annular plate 112 and the second annular plate 114 respectively have six through holes (number of through hole varies according to different embodiments). In some embodiments, the through holes in the first or second annular plate are threaded. The through holes on each plate are aligned with another plate. A bolt 115 is screwed into aligned through holes such as 112h and 114h to fasten the first annular plate 112 and the second annular plate 114.

Figure 4:
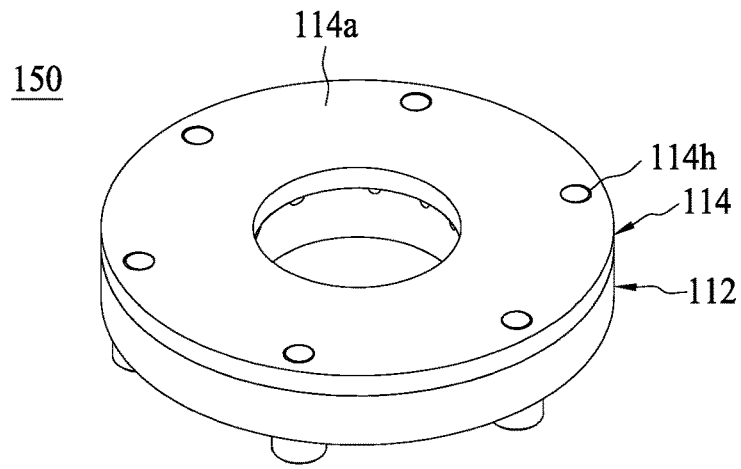
FIG. 4 is a perspective view of the air distributor in accordance with some embodiments of the present disclosure.

FIG. 4 is a perspective view of the air distributor 150 in FIG. 2 flipped. The second annular plate 114 is facing upward. A surface 114a of the second annular plate 114 is flat and toward the inner space 105A of the chamber 105 when the distributor is installed in the chamber 105 as in FIG. 1. The assembled air distributor 150 has a hollow region 119 around the center.

Figure 5:
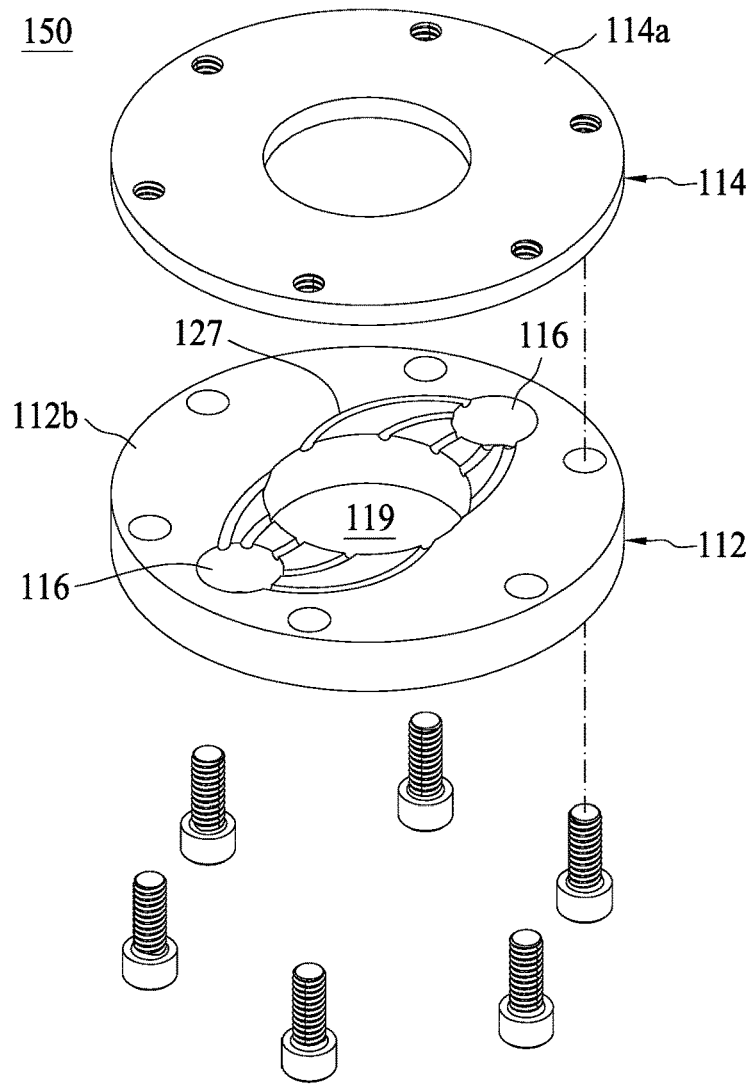
FIG. 5 is an explosion view of the air distributor in FIG. 4 in accordance with some embodiments of the present disclosure.

FIG. 5 is an explosion view of the air distributor in FIG. 4. Another surface 112b of the first annular plate 112 is revealed. The surface 112b is opposite to the surface 112a in FIG. 3 and interfaced with the second annular plate 114. There are several ditches 127 connected to a gas through hole 116. The ditches 127 are recessed under the surface 112b and each ditch 127 extends from the gas through hole 116 to the hollow region 119 of the first annular plate 112. Gas from the gas through hole 116 is guided by the ditches 127 and further flows into the hollow region 119. In the present embodiments, each gas through hole 116 is connected with five ditches 127. There are ten ditches 127 arranged symmetrically on the surface 112b. Gas is introduced into the hollow region 119 by the ditches 127 and distributed evenly to form a shower curtain.

Figure 6:
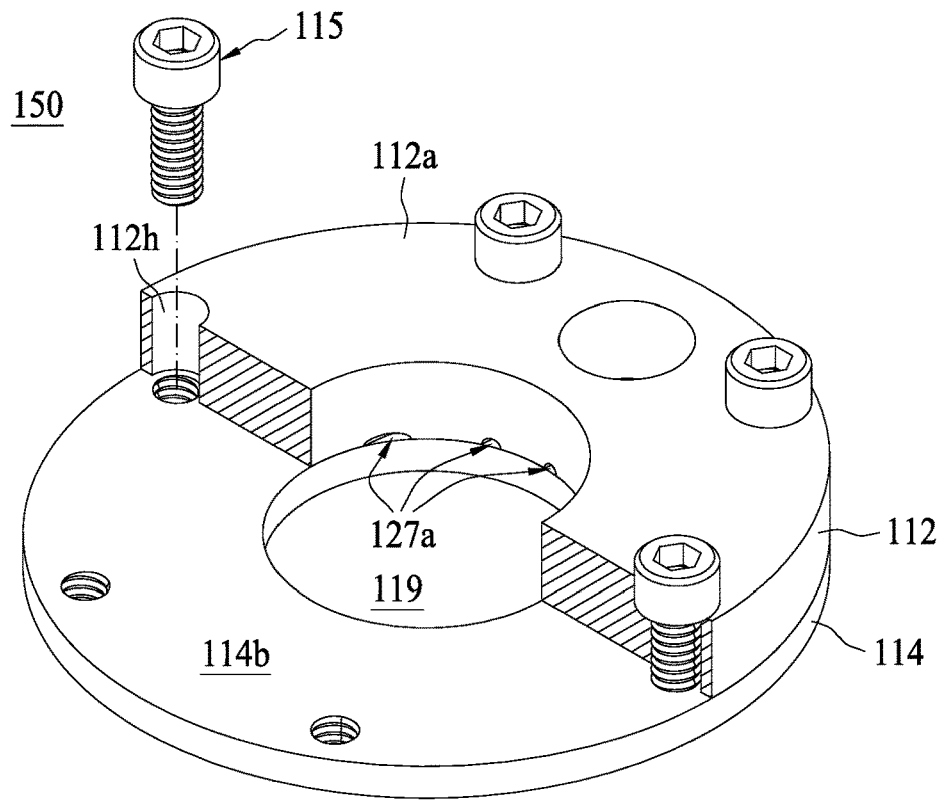
FIG. 6 is a perspective view of the air distributor in FIG. 2 along line AA' in accordance with some embodiments of the present disclosure.
Figure 7:
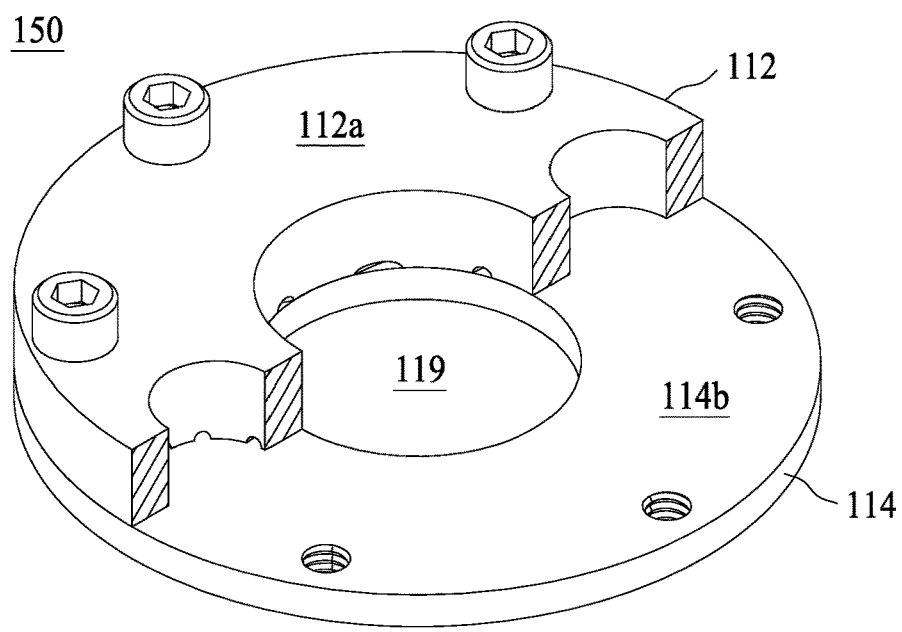
FIG. 7 is a perspective view of the air distributor in FIG. 2 along line BB' in accordance with some embodiments of the present disclosure.

FIG. 6 is a perspective view along line AA' of the air distributor 150 in FIG. 2. The first annular plate 112 is tightened to be against the second annular plate 114. Each ditch 127 has an open end 127a at the edge of the open region 119 and toward the open region 119. The open ends 127a are distributed symmetrically around the edge of the open region 119. In some embodiments, the open end 127a is a semicircle and each open end 127a has a same cross sectional area. FIG. 7 is a perspective view along line BB' of the air distributor 150 in FIG. 2. In some embodiments, a portion of the surface 114b is also carved to form several ditches and the ditches are arranged on the surface 114b in a pattern corresponding to the ditches 127 on surface 112b. The first annular plate 112 is assembled with the second annular plate 114, and the ditch 127 and its corresponding ditch on the second annular plate 114 form a tunnel inside the air distributor 150. In some embodiments, the tunnel inside the air distributor 150 is cylindrical.

Figure 8A:
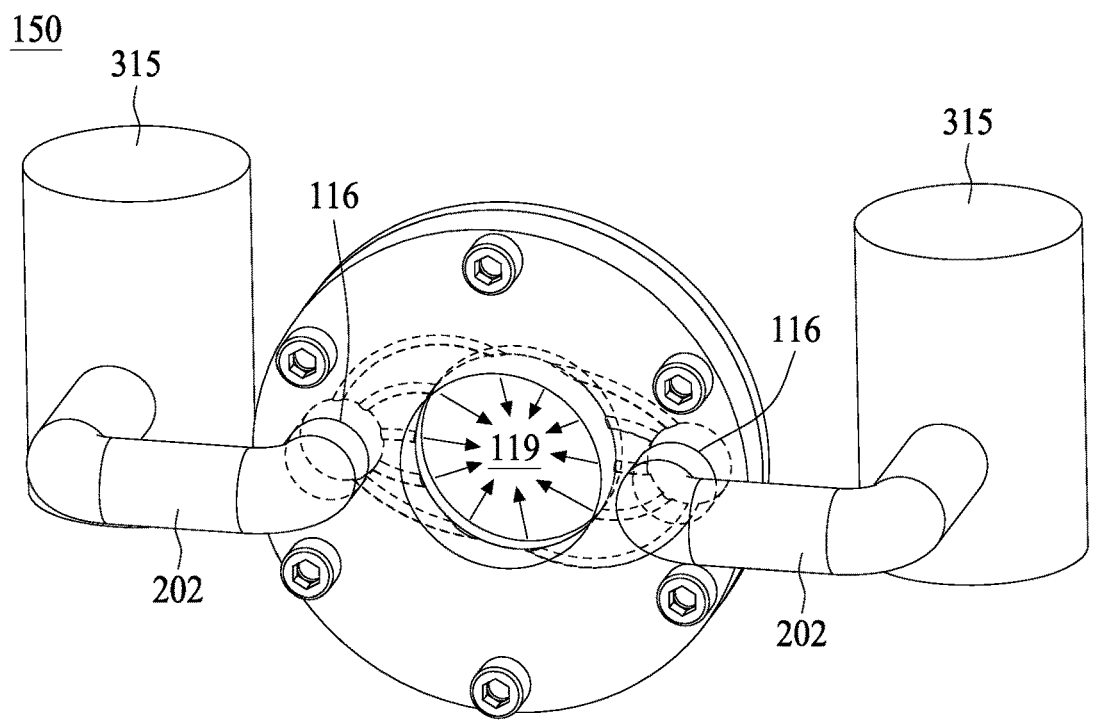
FIG. 8A and FIG. 8B are a perspective view of an air distributor connected with gas lines in accordance with some embodiments of the present disclosure.

FIG. 8A is a drawing showing an air distributor 150 under operation. Each gas through hole 116 of first annular plate 112 is connected to a gas line 202. The gas is supplied from a source such as a gas panel 315. Gas flows through the gas ling 202 and into a corresponding gas through hole 116. Gas is further introduced into the hollow region 119 by the ditches 127 inside the air distributor 150. The dotted arrow lines toward the center of hollow region 119 represent streams of gas released from the open ends 127a. Streams of released gas form an invisible partition wall or air curtain to separate etchant gas or byproducts on one side of the air distributor 150 from another side of the air distributor 150. The invisible partition wall or air curtain prevent byproduct from depositing on the transparent cover 110 on chamber sidewall 107 in FIG. 1.

Figure 9:
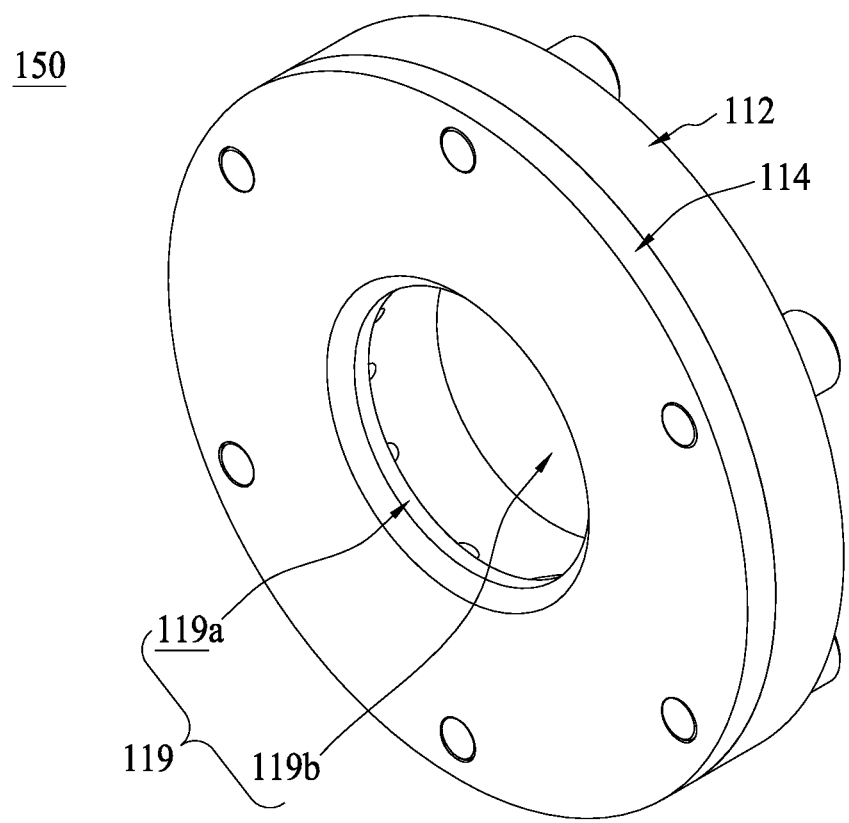
FIG. 9 is a perspective view of an air distributor with a tapered hollow region in accordance with some embodiments of the present disclosure.

In some embodiments, the inner edge of the first annular plate 112 or the second annular plate 114 is modified to guide the gas released from ditches toward the inner space 105A of chamber 105 in FIG. 1. As in FIG. 9, the inner edge of the air distributor 105 is tapered. The air distributor 105 has a central hollow region 119 with circular shape. The central hollow region 119 has a first opening 119a facing the chamber inner space 105A. A second opening 119b opposite to the first opening 119 facing the transparent cover 110. The first opening 119a has an area greater than the opening 119b. Gas released from the ditches forms an air curtain with a positive pressure toward the inner space 105A. The air curtain is designed to blow into the inner space 105A such that no byproducts are allowed to pass the air distributor 105. In some embodiments, the tapered angle of the inner edge is between about 5 degrees and about 15 degrees.

Figure 8B:
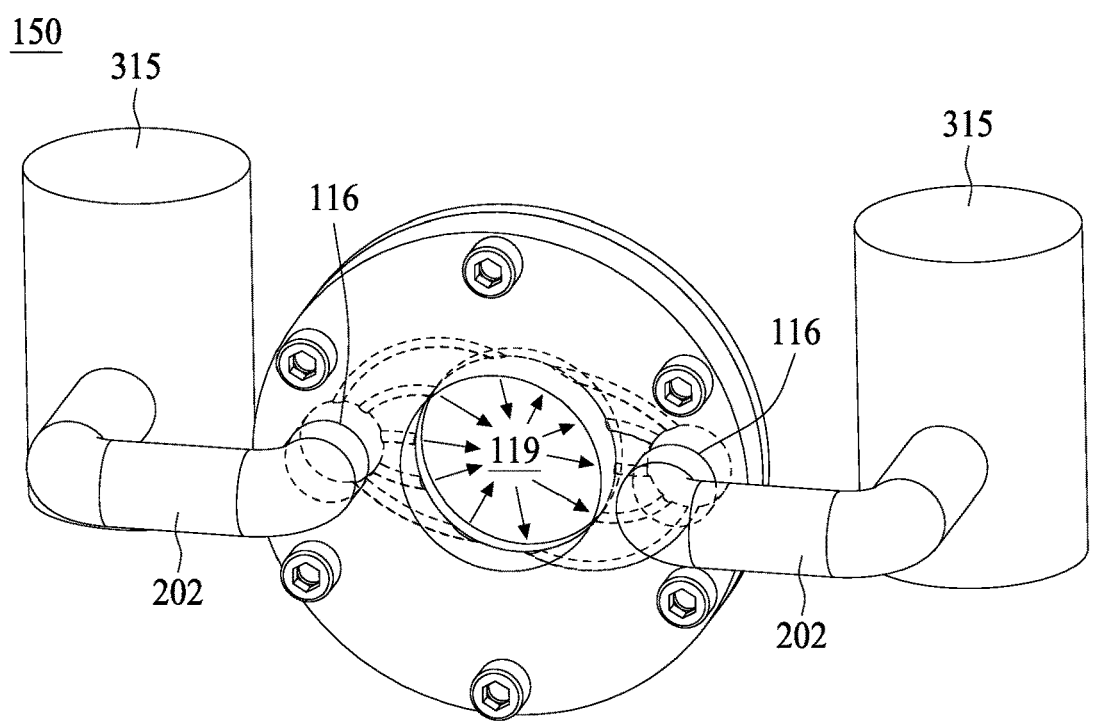

Referring to FIG. 8B, in some embodiments, there are two gas panels 315. One gas penal may operate to blow gas through a gas line 202 and into a corresponding gas through hole 116. Gas is further introduced into a hollow region 119 by several ditches 127 inside an air distributor 150. Another gas penal may operate to suck gas through another gas line 202 from another corresponding gas through hole 116. Gas is further sucked from a hollow region 119 by several ditches 127 inside an air distributor 150.

In some embodiments, the gas introduced into the air distributor is helium that is supplied from a same source of the gas for cooling wafer 132 in FIG. 1. During plasma dry etch, wafer 132 on the pedestal 120 is heated during ion bombardment, thus a helium gas is introduced to the backside of wafer 132 to bring wafer temperature down to an acceptable range. In some embodiments, the pedestal 120 is an electrostatic chuck (ESC) used to hold a wafer during the dry etch operation.

In addition to the dry etch operation, endpoint mode etch is also adopted to remove deposition film in a vapor deposition chamber. For example, in a chemical vapor deposition (CVD) chamber, thin films such as silicon oxide or silicon nitride are grown on the chamber inner wall as well as on the wafer. A plasma etch is used to clean the films buildup on the inner wall. In some embodiments, a similar OES and view port window as in FIG. 1 are implemented in the CVD chamber to detect the spectroscopy of the emission light during plasma clean in order to optimize the clean time. The air distributor 150 as in FIG. 1 is used to form an air curtain during clean. Therefore, the byproducts during plasma clean are unable to reach the transparent cover 110.

Monitoring of a plasma cleaning processes may be accomplished through optical emission spectroscopy (OES), a technique by which light emitted by a process, such as a plasma etch within chamber, is analyzed to see which wavelengths are present in the light. Different types of plasma chamber, such as PVD chamber, CVD chamber, or etching chamber may be applied by the plasma cleaning processes. Inferences about the process may then be drawn as a result of the intensity of various spectral lines present in the light. For example, presence of certain species within the chamber may be ascertained because each kind of molecule or atom has a characteristic optical emission at specific wavelengths (optical emission spectrum). When cleaning plasma reacts with accumulated byproducts 25, related product species are formed and may be identified by their unique and characteristic optical emission. After the accumulated byproducts 25 have been removed from a chamber and the chamber sidewall 107 are exposed to the plasma, there is a change in the optical emission. This change in optical emission can be used to detect an endpoint of the cleaning process.

A time-mode technique could be used for detecting the endpoint of plasma clean. The cleaning process is performed for a fixed period of time estimated to remove the byproducts 25 accumulated on the chamber sidewall 107. Thus, it is obvious that either under-cleaning or over-cleaning is likely to occur. Under-cleaning may lead to particle problems and degradation of processing stability. Over-cleaning results in the highly reactive cleaning gases attacking the chamber sidewall 107 and shortening its lifetime. Further, expensive cleaning gases may be wasted and cleaning time is not optimized.

Besides the aforementioned dry etch and CVD chamber, other tools use OES to monitor process or clean status are within the contemplated scope of the present disclosure.

The air distributor 150, as in FIG. 2 and FIG. 4, is in circular shape. However, in the present disclosure, it should not be deemed as a limitation. As in FIG. 10, an air distributor 450 is in quadrilateral shape. FIG. 11A is an explosion view of the air distributor 450 in FIG. 10. The air distributor 450 has a first annular plate 412 and a second annular plate 414. Both annular plates are quadrilateral and each has twelve through holes. In some embodiments, the through holes in the first or second annular plate are threaded. Similar to the circular type air distributor, a bolt 115 is screwed into through hole 412h and 414h to fasten the first annular plate 412 against to the second annular plate 414. In some embodiments, the size of the first annular plate 412 is same with the second annular plate 414.

Surface 414b is toward an inner space of a chamber while the air distributor 450 is installed in the chamber. In some embodiments, the chamber is configured for a plasma operation, for example reactive ion plasma etch or a CVD deposition. The plasma operation includes plasma etch or plasma clean.

The hollow region 119 is configured to form an air curtain when the air distributor 450 is in operation. Gas introduced into the air distributor 450 is guided by the ditches 427 into the hollow region 119. The ditches 427 are recessed from a surface 412a of the first annular plate 412. In some embodiments, the ditches 427 are arranged around the quadrilateral hollow region 119 as in FIG. 11A. In some embodiments, the hollow region 119 is at a central portion of the air distributor 119.

Figure 10:
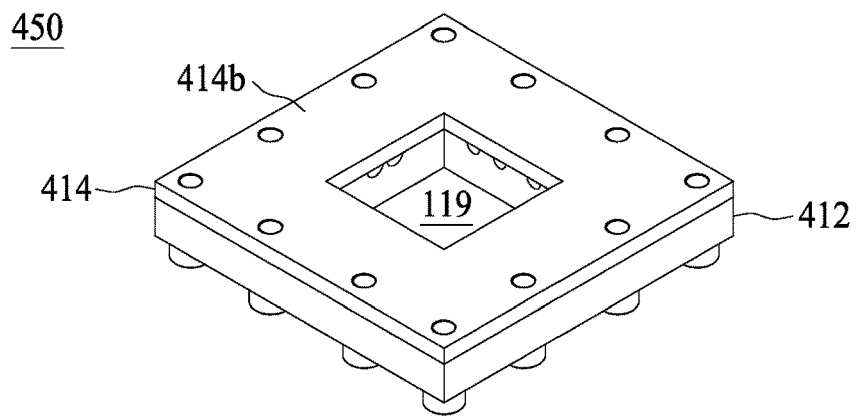
FIG. 10 is a perspective view of a quadrilateral air distributor in accordance with some embodiments of the present disclosure.
Figure 11A:
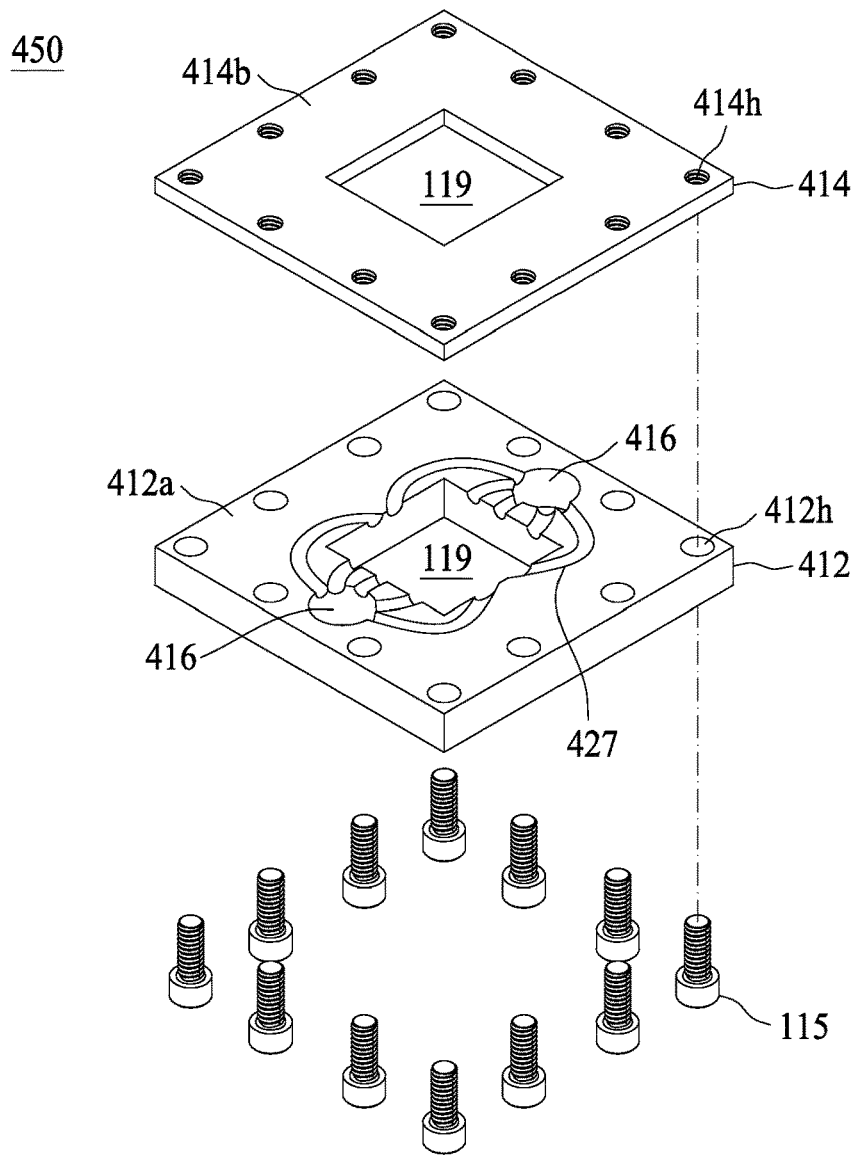
FIG. 11A is an explosion view of the quadrilateral air distributor in FIG. 10 in accordance with some embodiments of the present disclosure.
Figure 11B:
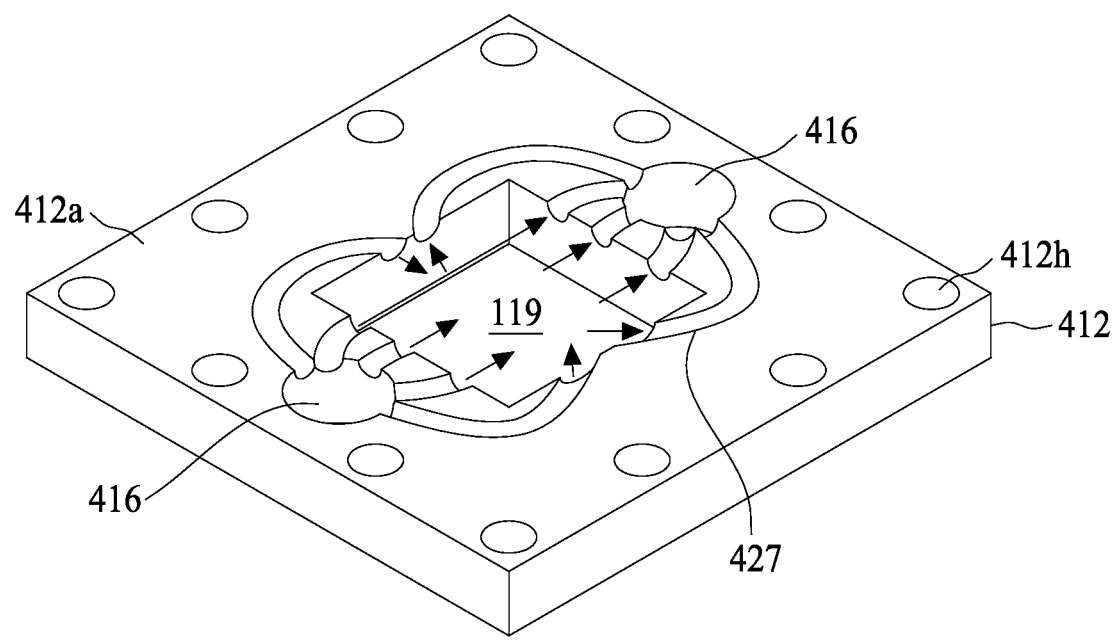
FIG. 11B is a perspective view of the quadrilateral air distributor in FIG. 10 in accordance with some embodiments of the present disclosure.
Figure 12:
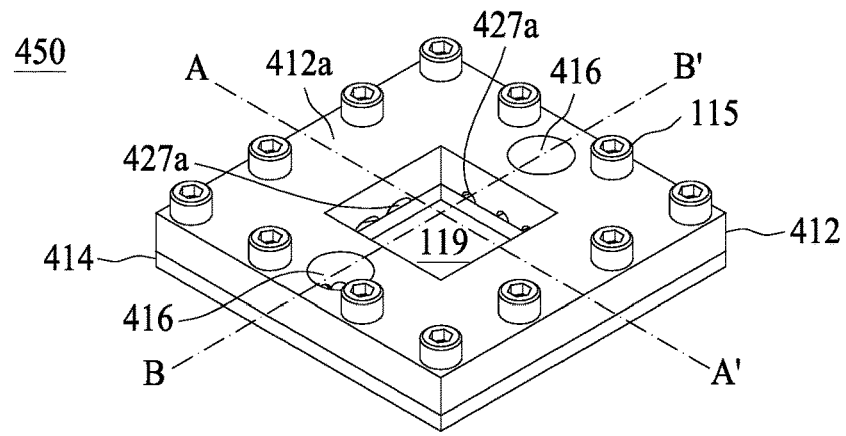
FIG. 12 is a perspective view of a quadrilateral air distributor in accordance with some embodiments of the present disclosure.

FIG. 12 is a perspective view of the air distributor 450 in FIG. 10 flipped. The first annular plate 412 is clamped with the second annular plate 414. The end 427a of each ditch 427 in the first plate 412 in FIG. 11A is exposed. The ditches 427 are tunnels to guide gas from gas through hole 416 into the hollow region 119. In some embodiment, one side of the hollow region 119 may have several ditch ends for blowing gas into the hollow region 119, and an opposite side may have several ditch ends for sucking gas from the hollow region 119 as shown in FIG. 11 B.

Figure 13:
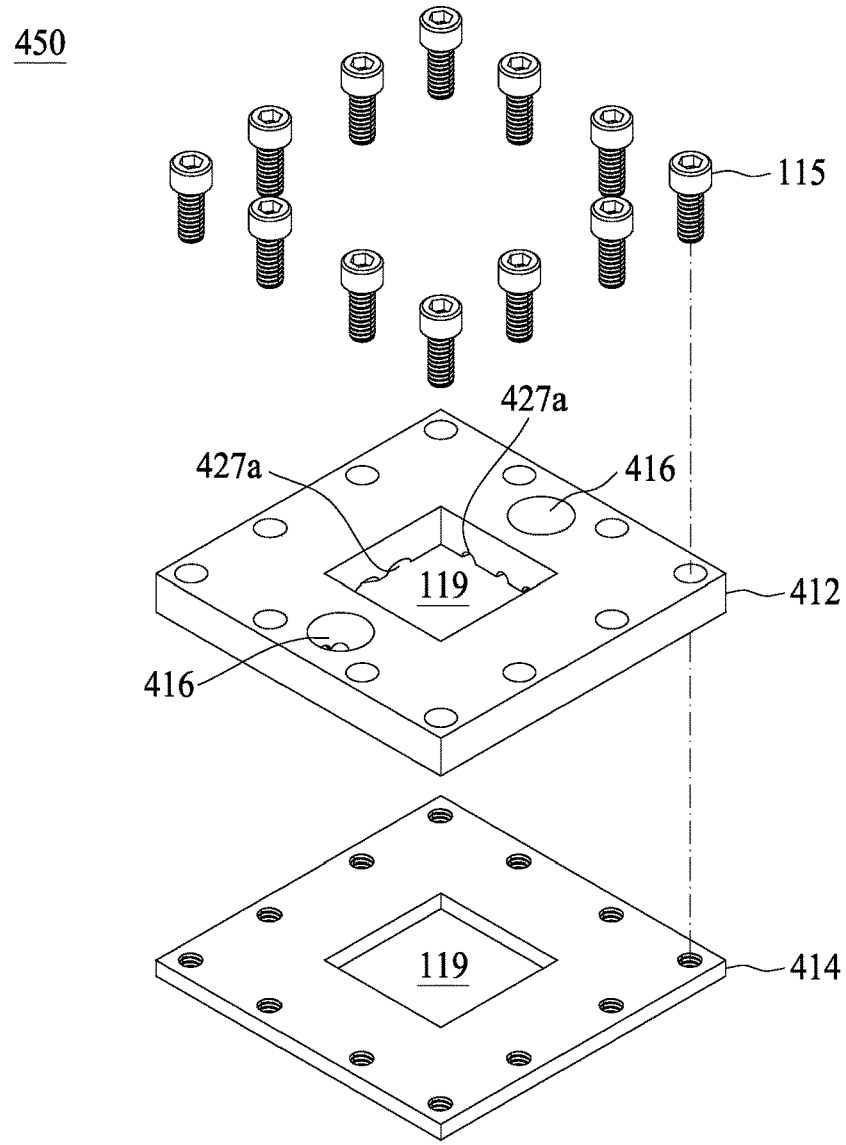
FIG. 13 is an explosion view of the quadrilateral air distributor in FIG. 12 in accordance with some embodiments of the present disclosure.

FIG. 13 is an explosion view of the air distributor 450 in FIG. 12. In the drawing, on one side of the hollow region 119, there are three ditch ends 427a, and on the other side, there is one ditch end 427a. In some embodiments, each side has a same number of ditch ends and symmetrically arranged around the edge of the hollow region.

Figure 14:
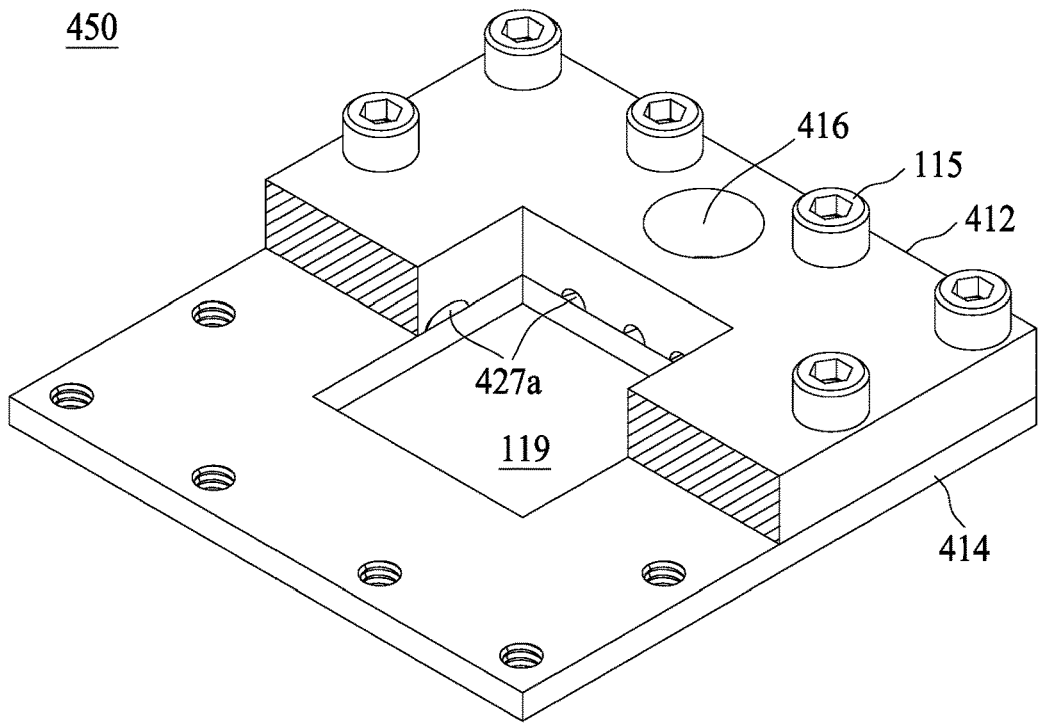
FIG. 14 is a perspective view of the air distributor in FIG. 12 along line AA' in accordance with some embodiments of the present disclosure.

FIG. 14 is a perspective view of the air distributor 450 in FIG. 12 cut along line AA'. Each ditch 427 has an open end 427a at the edge of the open region 119 and toward the open region 119. The open ends 427a are distributed symmetrically around the edge of the open region 119. In some embodiments, the open end 427a is a semicircle and each open end 427a has a same cross sectional area.

Figure 15:
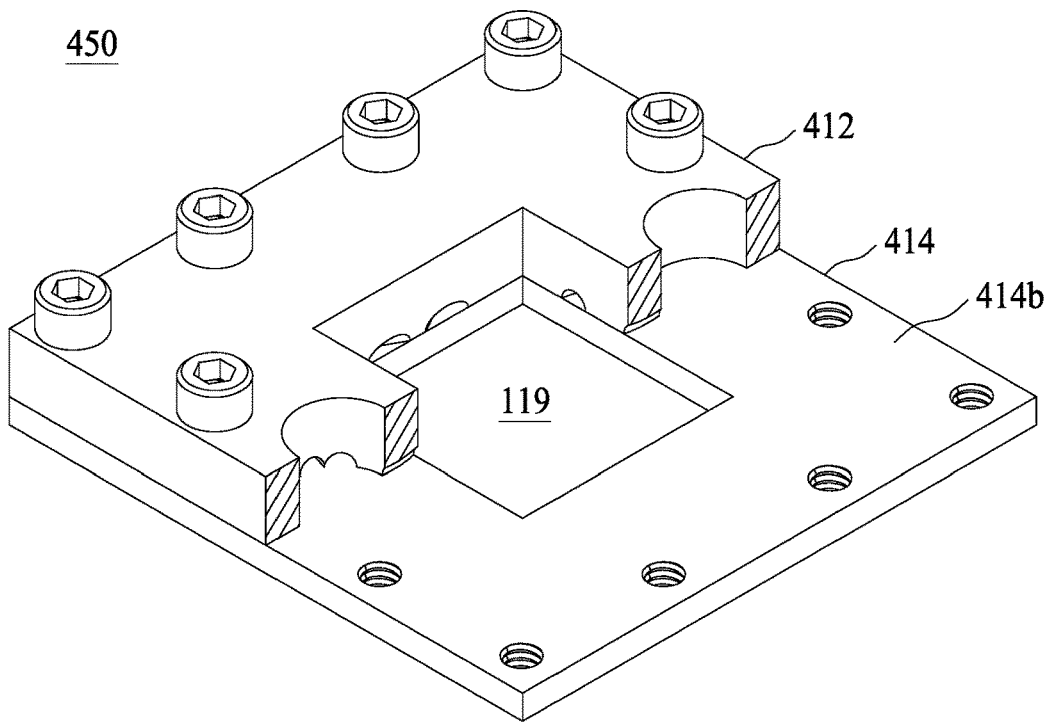
FIG. 15 is a perspective view of the air distributor in FIG. 12 along line BB' in accordance with some embodiments of the present disclosure.

FIG. 15 is a perspective view of the air distributor 450 in FIG. 12 cut along line BB'. In some embodiments, a portion of the surface 414b is also carved to form several ditches and the ditches are arranged on the surface 414b in a pattern corresponding to the ditches 427 on surface 412b. The first annular plate 412 is assembled with the second annular plate 414, and the ditch 427 and its corresponding ditch on the second annular plate 414 form a tunnel inside the air distributor 450. In some embodiments, the tunnel inside the air distributor 450 is cylindrical.

In some embodiments, the first annular plate has a same thickness of the second annular plate and each annular plate has a ditch. In some embodiments, the air distributor has more than one hollow region around the center region. Each hollow region is connected to a ditch for gas introduction.

A semiconductor manufacturing apparatus includes a chamber configured for plasma etching, a view port window on a sidewall of the chamber and configured to receive an optical emission spectroscopy (OES); and an air distributor located between the view port window and an inner space of the chamber. The air distributor includes a hollow region aligned with the transparent window and configured to generate an air curtain in the hollow region to isolate the view port from the inner space.

In many plasma etching systems an endpoint of an etching or a depositing process is detected using a light or an optical sensor, such as an OES 140, and a digital computer in controller. Typically, the optical sensor is set up, using narrow band pass filters, to monitor an intensity of light at a single characteristic wavelength associated with several reaction products produced by etching a layer or to monitor intensity of light at a wavelength associated with several gaseous reactants in plasma used to etch the layer. An accumulation of a gas depositing on the transparent cover 110 may alter some amount of light received by an OES 140, and thus may obscure a reading of the intensity of light at a single characteristic wavelength. The intensity of light is used for generating a derived value. The digital computer then compares several derived values, derived from the wavelength and intensity of light to a specified threshold value. Once the threshold has been exceeded, the digital computer determines when a specified endpoint of the etching or the depositing process has been reached. There may be several ways to determine the specified endpoint. One way may be to compare the values with the specified threshold value. Another way may be to compare a slope of a change in the values with a specified threshold slope. A user specifies which way is used to detect an endpoint prior to initiating an etching process.

An endpoint can be specified by several methods. One method specifies the endpoint as a point at which some certain number of derived values or slopes exceed a specified threshold and consecutively increase in magnitude. Another method specifies the endpoint as a point at which a certain number of derived values or slopes exceed a specified threshold and have consecutively decreased from a peak of those values. Yet, another method specifies the endpoint as a point at which a specified number of derived values or slopes are below a specified threshold and are consecutively decreasing, but only after the derived values or slopes has at least once exceeded the specified threshold.

Not only is keeping an intensity of light continuously without obscuring an important factor in determining an endpoint of a process in semiconductor manufacture, detail resolution about an intensity of light at various spectral lines present in the light may also be an important consideration. Because different plasma gas may produce different spectral lines. A precise measurement for various spectral lines may allow controlling of multiple processes simultaneously.

Dry etch differs from wet etch in that it usually does not have good etch selectivity to an underlying layer. Endpoint detection systems measure different parameters, such as a change in the etch rate, some types of etch products removed from an etch process, or change in several active reactants in a gas discharge. Emission intensity is directly related to a relative concentration of a species in plasma. In this manner the endpoint detector can determine when a reaction process is complete and proceeded into the underlying layer.

An example of a situation in which precise endpoint detection is important in fabricating MOS transistors is a processing step in which a thin "spacer" is formed adjacent to an MOS transistor gate. A silicon oxide film is deposited over a polysilicon gate that was defined by a prior etch step. Some results of properly terminated plasma etch of the silicon oxide film, producing silicon oxide spacers on all sides of the polysilicon gate. A channel width of the transistor may be governed by a width of the silicon oxide spacers. if the plasma etching of the silicon oxide layer is allowed to continue past its ideal endpoint, the silicon oxide spacers will be thinner than is ideal and resulting transistor channel width will be shorter than a channel width that was supposed to be produced.

An obscuring by an accumulation of a gas depositing on transparent cover 110 may not only diminish an intensity of light but may also increase an intensity of light. For example, some false peaks may be created by noise, which may exceed a threshold for some very small period of time. Some process may be design to stop as light intensity reaches certain peak value. As a result OES 140 will cause the process to be ended prematurely by detection of a false endpoint. Data about an intensity of light may go through various analyzing such as digital filtering, cross-correlating, normalization, or average normalization. Therefore, exactness about the intensity of light is indispensable to permit a very fine control of a processing time. Improvement of endpoint detection with air curtain is capable of being implemented on known chambers.

A semiconductor manufacturing apparatus includes a chamber, a view port window on a sidewall of the chamber and configured to receive an optical emission spectroscopy (OES); and an air distributor located between the view port window and an inner space of the chamber. The air distributor includes a hollow region aligned with the transparent window and configured to generate an air curtain in the hollow region to isolate the view port from the inner space.

In some embodiments, the air distributor is in the sidewall of the chamber.

In some embodiments, the air distributor includes anodized non-metallic material.

In some embodiments, the air distributor includes a gas inlet configured for receiving an inert gas.

In some embodiments, the air distributor includes a first annular plate interfaced with a second annular plate, the first annular plate and the second annular plate are fastened against each other with a bolt.

In some embodiments, the semiconductor manufacturing apparatus further includes a ditch on a surface of the first annular plate or the second annular plate, wherein the ditch is configured to be a gas flow path.

In some embodiments, the air distributor includes an internal tunnel, the internal tunnel includes a first end toward the hollow region and a second end configured for receiving an inert gas.

In some embodiments, the view port window has an area substantially same to an area of the hollow region.

In some embodiments, the semiconductor manufacturing apparatus further includes a quartz plate sealed at the view port window.

In some embodiments, the OES is an endpoint detector.

In some embodiments, the view port window includes a unit pressure control.

A semiconductor manufacturing apparatus includes a chamber, a pedestal for receiving a wafer and located in the chamber, a window on a sidewall of the chamber and configured to receive an optical emission spectroscopy (OES) of light emission from the chamber; and an air distributor between the window and the pedestal, wherein the air distributor has a hollow region configured to have an air curtain formed therein.

In some embodiments, the air distributor is embedded in a wall of the chamber.

In some embodiments, the air distributor includes a gas through hole configured to connect with a gas line.

In some embodiments, the semiconductor manufacturing apparatus further includes a gas line.

In some embodiments, the air distributor is shaped in polygonal, or circular.

In some embodiments, the air distributor has a gas tunnel inside the air distributor and connected with a gas through hole, and the gas through hole is on a surface of the air distributor.

In some embodiments, the air distributor has a gas tunnel inside the air distributor and the gas tunnel is extended to the hollow region.

A semiconductor manufacturing apparatus includes an air distributor inside a chamber, wherein the air distributor includes, a first annular plate and a second annular plate bolted through a through hole, a gas through hole in the first annular plate and the gas through hole extending from a first surface of the first annular plate to a second surface of the first annular plate, a ditch on the second surface of the first plate and connected with the gas through hole on the second surface of the first plate; wherein the ditch extends from the gas through hole to a center hollow region of the first plate. In some embodiments, the chamber is configured for an etching operation.

In some embodiments, the semiconductor manufacturing apparatus further includes a ditch on a surface of the second annular plate, wherein the surface is against to the second surface of the first annular plate.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the invention.

What is claimed is:

1. A semiconductor manufacturing apparatus, comprising:
   a chamber; and
   an air distributor inside a chamber, wherein the air distributor includes:
     a first annular plate and a second annular plate disposed in an interior volume of the chamber, wherein an inner surface of the first annular plate and an inner surface of the second annular plate are connected to each other;
     a hollow region defined by the first annular plate and the second annular plate;
     at least one first gas through hole and at least one second gas through hole extended from an outer surface of the first annular plate to the inner surface of the first annular plate;
     at least one first gas line connected with the at least one first gas through hole, and at least one second gas line connected with the at least one second gas through hole; and
     a plurality of first ditches and second ditches between the inner surface of the first annular plate and the inner surface of the second annular plate, wherein the first ditches are connected with the at least one first gas through hole and extended from the at least one first gas through hole to the hollow region to blow an inert gas toward the hollow region, and the second ditches are connected with the at least one second gas through hole and extended from the at least one second gas through hole to the hollow region to suck the inert gas from the hollow region, wherein the first ditches and the second ditches are arranged symmetrically around edges of the hollow region.

2. The semiconductor manufacturing apparatus of claim 1, wherein the edges of the hollow region comprise tapered edges.

3. The semiconductor manufacturing apparatus of claim 1, wherein the at least one first gas through hole and the at least second gas through hole are arranged symmetrically.

4. The semiconductor manufacturing apparatus of claim 1, further comprising a first gas panel connected to the at least one first gas through hole and configured to supply the inert gas to the hollow region through the at least one first gas line, the at least one first gas through hole and the plurality of first ditches.

5. The semiconductor manufacturing apparatus of claim 4, further comprising a second gas panel connected to the at least one second gas through hole and configured to suck the inert gas from the hollow region through the plurality of second ditches, the at least one second gas through hole and the at least one second gas line.

6. A semiconductor manufacturing apparatus, comprising:
   an air distributor inside a chamber, wherein the air distributor includes:
     a first annular plate and a second annular plate disposed in an interior volume of the chamber, wherein an inner surface of the first annular plate and an inner surface of the second annular plate are connected to each other;
     a hollow region defined by the first annular plate and the second annular plate;
     at least one gas supply through hole and at least one gas exhaust through hole extended from an outer surface of the first annular plate to the inner surface of the first annular plate;
     at least one gas supply line connected with the at least one first gas supply through hole, and at least one gas exhaust line connected with the at least one second gas exhaust through hole; and
     a plurality of gas supply ditches and gas exhaust ditches between the inner surface of the first annular plate and the inner surface of the second annular plate, wherein the gas supply ditches are connected with the at least one gas supply through hole and extended from the at least one gas supply through hole to the hollow region to blow a gas toward the hollow region, and the gas exhaust ditches are connected with the at least one gas exhaust through hole and extended from the at least one gas through exhaust hole to the hollow region to suck the gas from the hollow region.

7. The semiconductor manufacturing apparatus of claim 6, further comprising:
   a view port window on a sidewall of the chamber and configured to receive an optical fiber; and
   an optical emission spectroscopy (OES) external to the chamber and connected with the optical fiber.

8. The semiconductor manufacturing apparatus of claim 7, further comprising a transparent cover disposed at the view port window.

9. The semiconductor manufacturing apparatus of claim 6, wherein the air distributor is protruded from a sidewall of the chamber to the interior volume of the chamber.

10. The semiconductor manufacturing apparatus of claim 6, wherein the air distributor includes anodized non-metallic material.

11. The semiconductor manufacturing apparatus of claim 6, further comprising a gas supply panel connected to the at least one gas supply through hole and configured to supply the gas to the hollow region through the at least one gas supply line, the at least one gas supply through hole and the plurality of gas supply ditches.

12. The semiconductor manufacturing apparatus of claim 11, wherein the gas supply panel is an inert gas panel.

13. The semiconductor manufacturing apparatus of claim 11, further comprising a gas exhaust panel connected to the at least one gas exhaust through hole and configured to suck the inert gas from the hollow region through the at least one gas exhaust line, the at least one gas exhaust through hole and the plurality of gas exhaust ditches.

14. A semiconductor manufacturing apparatus, comprising:
   an air distributor inside a chamber, wherein the air distributor includes:
      a first annular plate and a second annular plate disposed in an interior volume of the chamber, wherein an inner surface of the first annular plate and an inner surface of the second annular plate are connected to each other;
      a hollow region defined by the first annular plate and the second annular plate;
      at least one first gas through hole and at least one second gas through hole extended from an outer surface of the first annular plate to the inner surface of the first annular plate;
      at least one first gas line connected with the at least one first gas through hole, and at least one second gas line connected with the at least one second gas through hole; and
      a plurality of first ditches and second ditches between the inner surface of the first annular plate and the inner surface of the second annular plate, wherein the first ditches are connected with the at least one first gas through hole and extended from the at least one first gas through hole to the hollow region to blow an inert gas toward the hollow region, and the second ditches are connected with the at least one second gas through hole and extended from the at least one second gas through hole to the hollow region to suck the inert gas from the hollow region.

15. The semiconductor manufacturing apparatus of claim 14, further comprising:
   a view port window on a sidewall of the chamber and configured to receive an optical fiber; and
   an optical emission spectroscopy (OES) external to the chamber and connected with the optical fiber.

16. The semiconductor manufacturing apparatus of claim 15, further comprising a transparent cover disposed at the view port window.

17. The semiconductor manufacturing apparatus of claim 14, wherein the air distributor is protruded from a sidewall of the chamber to the interior volume of the chamber.

18. The semiconductor manufacturing apparatus of claim 14, wherein the air distributor includes anodized non-metallic material.

19. The semiconductor manufacturing apparatus of claim 14, further comprising a first gas panel connected to the at least one first gas through hole and configured to supply the inert gas to the hollow region through the at least one first gas line, the at least one first gas through hole and the plurality of first ditches.

20. The semiconductor manufacturing apparatus of claim 19, further comprising a second gas panel connected to the at least one second gas through hole and configured to suck the inert gas from the hollow region through the plurality of second ditches, the at least one second gas through hole and the at least one second gas line.

* * * * *